United States Patent
Bucksch

(10) Patent No.: US 7,180,313 B2
(45) Date of Patent: Feb. 20, 2007

(54) TEST DEVICE FOR WAFER TESTING DIGITAL SEMICONDUCTOR CIRCUITS

(75) Inventor: Thorsten Bucksch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/995,111

(22) Filed: Nov. 24, 2004

(65) Prior Publication Data

US 2005/0162176 A1    Jul. 28, 2005

(30) Foreign Application Priority Data

Nov. 27, 2003   (DE)   ............................... 103 55 296

(51) Int. Cl.
*G01R 31/02* (2006.01)
(52) U.S. Cl. .................................................. 324/754
(58) Field of Classification Search .................... None
See application file for complete search history.

(56) References Cited

U.S. PATENT DOCUMENTS

| | | | | |
|---|---|---|---|---|
| 5,070,297 A * | 12/1991 | Kwon et al. | ................. | 324/754 |
| 5,512,838 A * | 4/1996 | Roach | ........................ | 324/754 |
| 5,583,446 A * | 12/1996 | Takeuchi et al. | ............ | 324/754 |
| 5,794,175 A * | 8/1998 | Conner | ....................... | 702/119 |
| 5,974,662 A | 11/1999 | Eldridge et al. | | |
| 6,392,296 B1 * | 5/2002 | Ahn et al. | ................... | 257/698 |
| 6,462,528 B1 * | 10/2002 | Markozen | .................. | 324/72.5 |
| 6,476,598 B2 * | 11/2002 | Noda | ....................... | 324/158.1 |
| 6,483,328 B1 * | 11/2002 | Eldridge et al. | ............ | 324/754 |
| 6,812,690 B2 * | 11/2004 | De Jong et al. | ......... | 324/158.1 |
| 6,924,653 B2 * | 8/2005 | Schaeffer et al. | ........... | 324/754 |
| 6,937,037 B2 * | 8/2005 | Eldridge et al. | ............ | 324/754 |
| 2002/0153876 A1 * | 10/2002 | De Jong et al. | ......... | 324/158.1 |
| 2004/0075459 A1 * | 4/2004 | Eldridge et al. | ............ | 324/765 |
| 2004/0174177 A1 * | 9/2004 | Iino et al. | .................... | 324/757 |

FOREIGN PATENT DOCUMENTS

WO    WO 2003/065064 A2    8/2003

* cited by examiner

*Primary Examiner*—Ha Tran Nguyen
*Assistant Examiner*—Richard Isla-Rodas
(74) *Attorney, Agent, or Firm*—Edell, Shapiro & Finnan LLC

(57) ABSTRACT

The invention relates to a test device for testing digital semiconductor circuits at wafer level having a probe card which sends/receives digital test signals to/from a test head and distributes signal channels, carrying test signals, to the respective location on the wafer via an interposer. The interposer has a printed circuit board with contact pins on both sides, and a needle or contact stud card. Additionally, all signal channels in the test device or signal channels which carry time-critical test signals in the test device contain a respective signal amplifier, the signal amplifiers preferably being digital signal amplifiers which are mounted on the printed circuit board of the interposer.

8 Claims, 3 Drawing Sheets

TEST DEVICE FOR WAFER TESTING DIGITAL SEMICONDUCTOR CIRCUITS

CROSS REFERENCE TO RELATED APPLICATIONS

This application claims priority under 35 USC §119 to German Application No. DE 103 55 296.0, filed on Nov. 27, 2003, and entitled "Test Device for Wafer Testing Digital Semiconductor Circuits," the entire contents of which are hereby incorporated by reference.

FIELD OF THE INVENTION

The present invention relates to a test device for testing digital semiconductor circuits at wafer level. More particularly, the present invention relates to a test device having a probe card which sends/receives digital test signals to/from a test head and distributes signal channels carrying test signals to a respective location on the wafer via an interposer, which has a printed circuit board with contact pins on both sides, and a needle or contact stud card.

BACKGROUND

As the performance of integrated circuits particularly memory chips, rises the demands on testing also increase. At operating frequencies in the range of 500 MHz to 1 GHz, effects come to the foreground which were previously negligible for low-frequency signals. Particularly in the case of the "wafer test", in which a test device is used to test signals directly from chips on the wafer. The problem of parasitic effects due to relatively long signal paths in comparison with a test housing of the chips need to be overcome.

Another disadvantage is the use of needles or other resilient probe contacts giving rise to intense reciprocal effects as a result of the very short distance between the two sides in the region of the needle arrangement. These reciprocal effects can influence or interfere with the signals. Particularly in the case of digital signals with a low voltage amplitude, the signal influencing or crosstalk limits the maximum signal frequency which can be used and the input and output data windows. In the case of analog signals, the signal-to-noise ratio and hence the measurement resolution and sensitivity of the system are reduced.

Increased coupling of capacitive or inductive type reduces the yield during the wafer test and limits the testability of critical parameters.

The conventional contact technology attenuates the amplitude of the signal on the basis of frequency. Reflections cause ripples in the signal profile which can result in erroneous evaluation.

To date, the parasitic effects have been reduced by using materials and design rules which differ from standard manufacturing practice of the probe cards. This has resulted in a drastic price increase. High-performance probe cards are therefore between 1.5 and 3 times more expensive than corresponding cards for standard applications.

SUMMARY

An aspect of the invention is thus to solve the above mentioned problems inexpensively and efficiently, and the invention provides a test device which suppresses the interference and signal distortions which have arisen in the signal path to date.

In accordance with one aspect of the invention, which specifies a test device for testing digital semiconductor circuits at wafer level, having a probe card which sends/receives digital test signals to/from a test head and distributes signal channels carrying test signals to the respective location on the wafer via an interposer, which has a printed circuit board with contact pins on both sides, and a needle or contact stud card. This test device is characterized in that all signal channels in the test device or signal channels which carry time-critical test signals in the test device contain a respective signal amplifier.

Additionally, digital systems have the option of reamplifying the signals which arrive at and leave the probe card using extremely simple chips. To this end, a digital amplifier is switched into the signal path for each signal. If this is done, as is preferred, as close as possible to the needle or contact stud, then it is possible to eliminate a great deal of signal distortions and interference which arise and to provide the chip pin on the wafer or tester with largely interference-free signals at the probe interface.

Since most probe cards used today contain an "interposer" which mechanically and thermally decouples the probe card having the interface to the tester and the needles mounted on a ceramic element, the inventive signal amplifiers are preferably mounted on the printed circuit board of the interposer. The existing interposer is thus replaced by an active circuit arrangement which contains an amplification circuit at least for every time-critical signal channel or for all signal channels. The received or transmitted signal is thus reamplified after passing through the probe card and is purged of interfering signal influences. One advantage is the simple implementation in existing test systems without the need to change the basic design of the contact system, or in other words, allowing the ability to retrofit existing systems with the active circuit arrangement in accordance with an embodiment of the present invention. A further advantage is the significant cost reduction, since the use of the active elements allows the rest of the system to be produced in an inexpensive form.

There are a number of options for implementing the signal amplification: if testing is conducive to purely digital conversion of the input/output signals, then a two-stage logic inversion element (buffer) can undertake the signal amplification. If, on the other hand, the test requires a particular signal level which differs from the supply voltage VDD for the high level and ground for the low level, for example, the invention provides an amplifier circuit having variable high and/or low levels. In this context, it should be mentioned that it is not absolutely necessary for all signal amplification elements to be implemented with variable high and/or low signal levels.

The above and still further aspects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

A basic arrangement and exemplary embodiments of a test device based on the invention are described below with reference to the drawings. In the FIGs. of the drawing, specifically.

DETAILED DESCRIPTION

Figure 1:
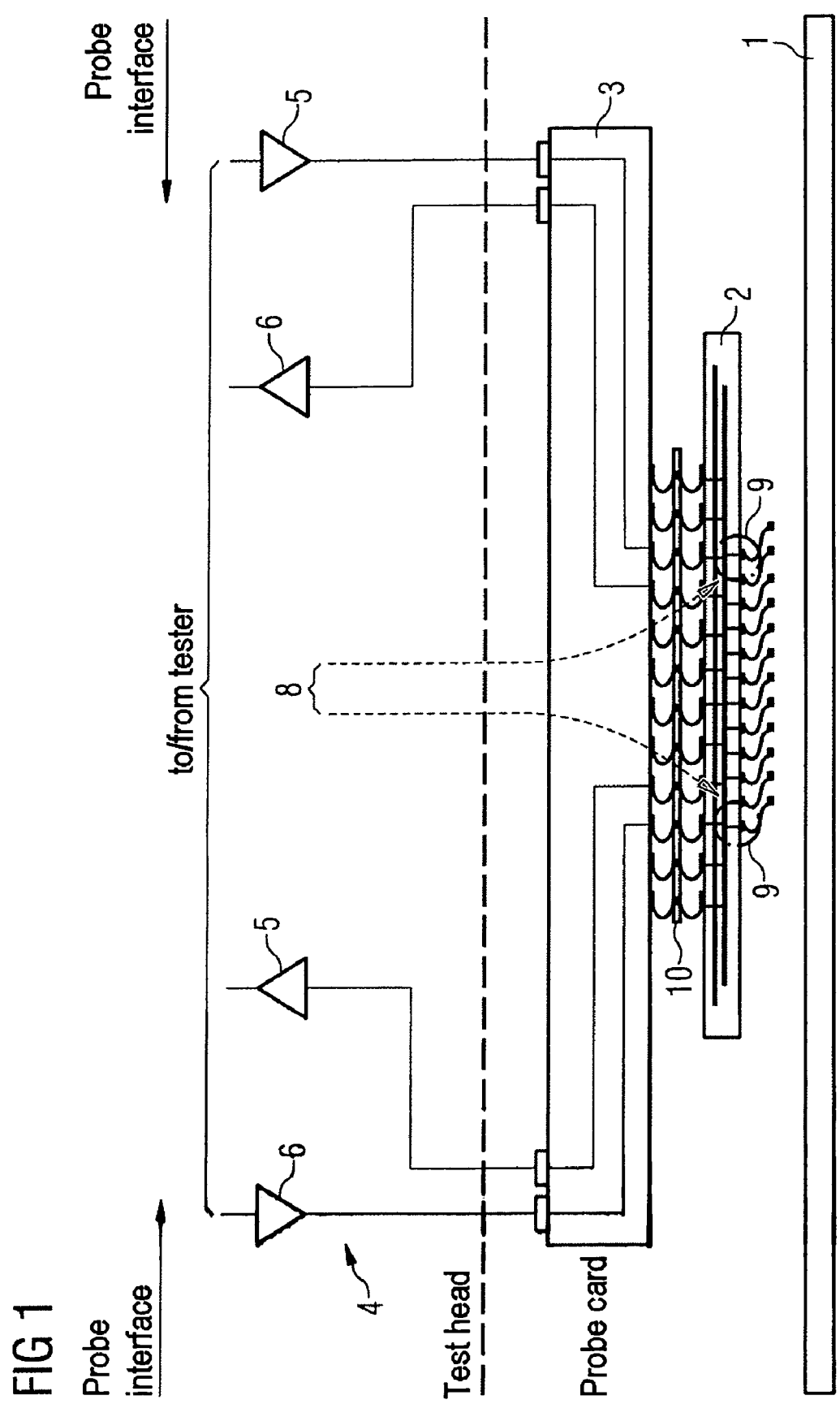
FIG. 1 schematically illustrates a basic arrangement of a test device in accordance with an aspect of the present invention.

FIG. 1 shows a schematic illustration of a wafer test device in accordance with an embodiment of the present invention. This test device tests chips on a wafer 1 using test signals which are supplied to these chips and are derived therefrom. In order to distribute these signals physically over a number of chips on the wafer 1, an adapter device ("space transformer") 2 is provided which forms a needle or contact stud card. The test head 4 contains a probe card 3, which has a probe interface to the teste. The driver and receiver chips 5, 6 may be provided for signal amplification on the probe interface to the tester.

In this context, it should be mentioned that high-performance test devices involve the tester (not shown) also routing "fly-by" signals to fly-by connection points 9, which are not actual test signals for testing the chips on the wafer 1, but rather used for signal conditioning and timing calibration for the test signals in the tester. The lines carrying these fly-by signals are denoted by 8 in FIG. 1.

In addition, between the needle or contact stud card 2 and the probe card 3, the test device comprises an "interposer" 10 which mechanically and thermally decouples the probe card 3, with its interface to the tester, and the needles or contact studs on the needle or contact stud card 2, which are mounted on a ceramic element. This interposer 10 comprises a printed circuit board, plated-through holes and contact pins on both sides.

In the case of the preferred exemplary embodiment, the signal amplifiers employed by the invention are now placed on this interposer 10, which means that they are therefore situated in substantially direct proximity to the needles.

Figure 2:
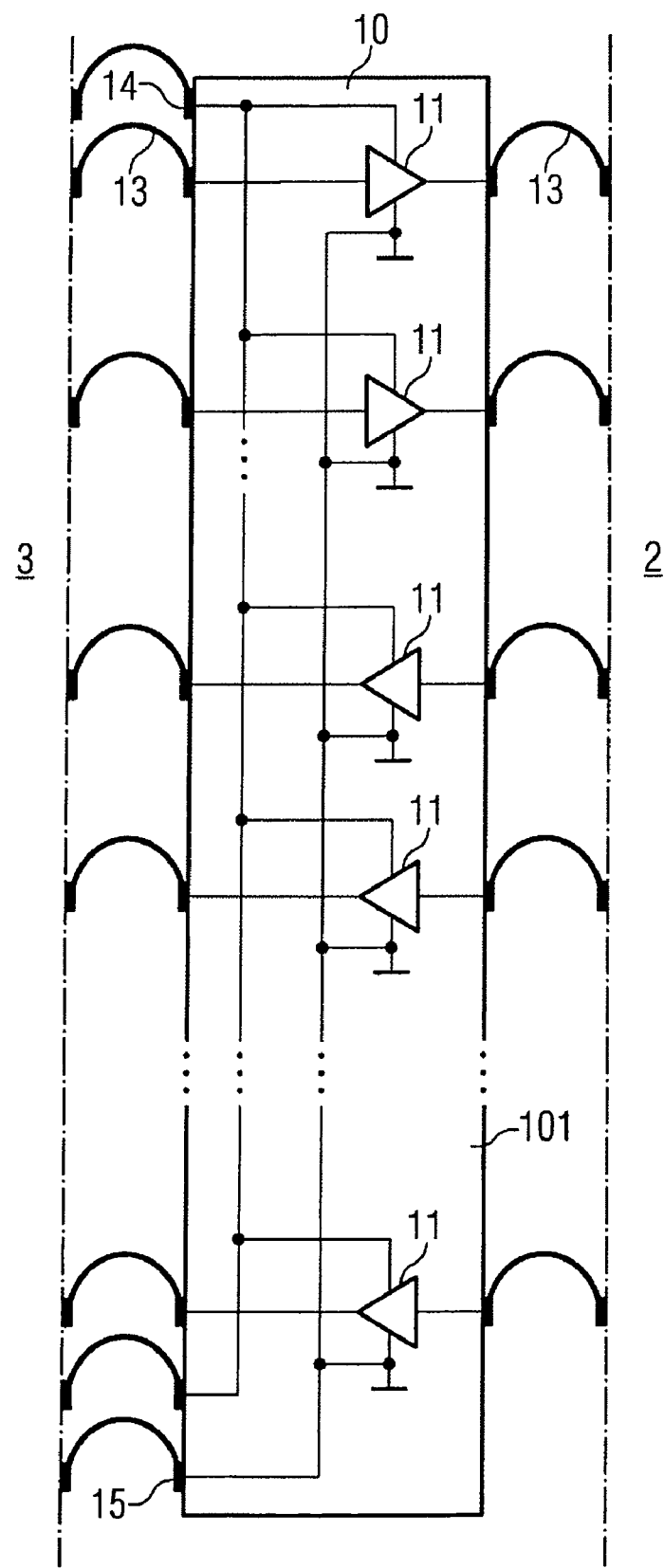
FIG. 2 schematically illustrates an interposer equipped with the inventive signal amplifiers as a preferred exemplary embodiment of the invention.

FIG. 2 schematically shows a preferred exemplary embodiment of an interposer 10 (forming an active part) which contains the inventive signal amplifier 11. As mentioned, the interposer 10 contains a printed circuit board 101 and contact pins 13, 14, 15 on both sides, said contact pins making contact with the probe card 3 on one side and making contact with the needle or contact stud card 2 on the other side.

In accordance with one embodiment, at least one signal amplifier 11 is set up such that it amplifies the respective signal received from the wafer 1 or transmitted to the wafer (1) using stipulated high and low levels.

By contrast, FIG. 2 shows another embodiment, in which the signal amplifiers 11 are set up such that they amplify the respective signal which is received from the wafer 1 or transmitted to the wafer 1 using variable high and/or low signal levels. To this end, the interposer 10 has additional pins 14 and 15 which can be used for externally supplying, i.e. from the tester, a high and a low signal level, respectively. Naturally, it is also possible for just some of the signal amplifiers to be set up for setting the high and low signal levels. In addition, in a departure from FIG. 2, the signal amplifiers 11 may also each be supplied with different signal levels, which requires additional pins 14, 15.

As previously mentioned, the signal amplifiers 11 on the interposer 10 preferably form digital signal amplifiers in the form of a buffer.

Figure 3:
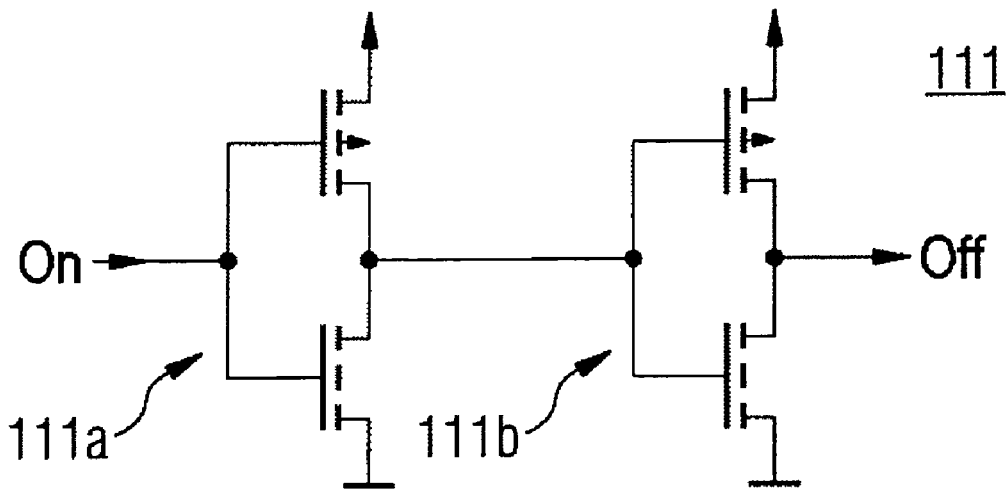
FIG. 3 shows a first embodiment of a signal amplifier with fixed high and low levels in accordance with an additional aspect of the present invention.

FIG. 3 shows a circuit diagram of an ordinary digital signal amplifier 111 formed from two series-connected CMOS inverters 111a and 111b. The input signal ON supplied to this digital signal amplifier 111 is amplified using fixed high and low levels and is output as an output signal OFF.

Figure 4:
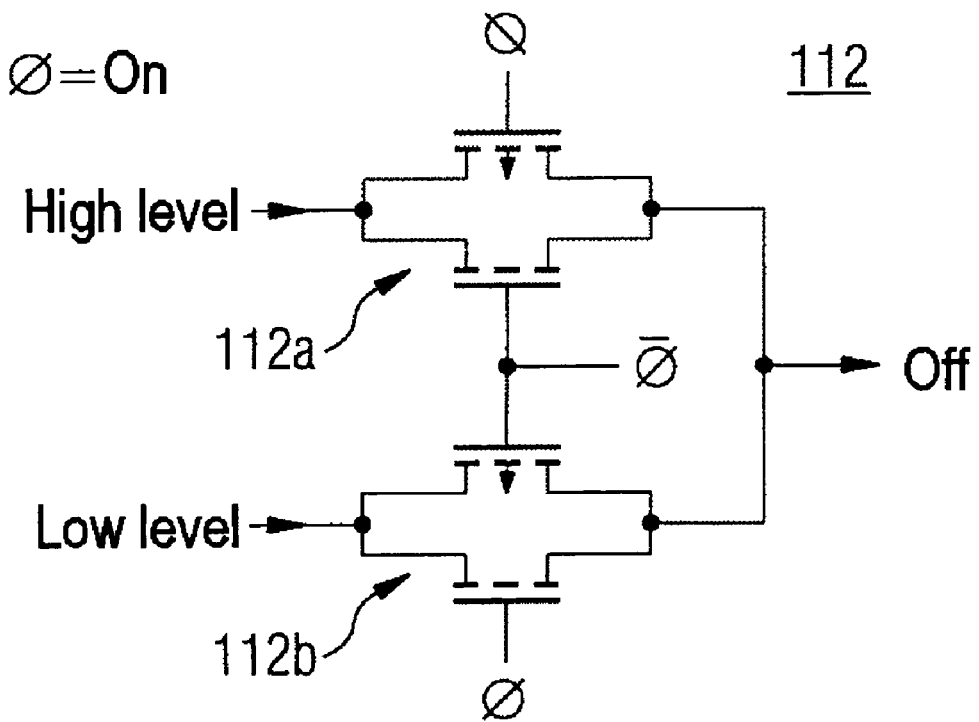
FIG. 4 shows a further embodiment of a signal amplifier with variable high and low signal levels in accordance with a further aspect of the present invention.

FIG. 4 shows a second embodiment of a digital signal amplifier 112 which comprises two MOS transfer gates 112a and 112b connected in parallel with one another. The transfer gate 112a at the top in FIG. 4 is supplied with the respective desired high level and the transfer gate 112b shown at the bottom is supplied with the respective desired low level, while the inputs of both transfer gates are respectively supplied with the true and complementary input signals $\phi$, $\bar{\phi}$.

The circuit described above and shown in the figures makes it possible to retrofit passive interfaces in test devices with active, preferably digital signal amplification. This makes it possible to suppress interference and signal distortions which have arisen in the signal path. The inexpensive alternative proposed by the invention may thus be used to avoid cost-intensive optimization of the hardware in the test device.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Symbols
1 Wafer
2 Needle or contact stud card
3 Probe card
4 Test head
5,6 Receiver and driver in the probe interface
8 Fly-by signals
9 Fly-by connection points
10 Interposer
11 Signal amplifier
13 Contact pins
14 High-level and low-level contact pins
111 First embodiment of the digital signal amplifier
111a First inverter
111b Second inverter
112 Second embodiment of the digital signal amplifier
112a First transfer gate
112b Second transfer gate
$\phi$, $\bar{\phi}$ True and complementary input signal

What is claimed is:

1. A test device for testing digital semiconductor circuits at wafer level, comprising:
   an interposer comprising a printed circuit board with contact pins on both sides;
   a needle or contact stud card; and
   a probe card which sends and receives digital test signals to and from a test head and distributes signal channels, carrying test signals, to respective locations on a wafer via the interposer;

wherein:
the interposer is arranged between the needle or contact stud card and the probe card so as to mechanically and thermally decouple an interface of the probe card with the test head and needles or contact studs disposed on the needle or contact stud card;

all signal channels in the test device or signal channels which carry time-critical test signals in the test device comprise a respective logic signal amplifier mounted on the printed circuit board of the interposer; and each logic signal amplifier amplifies a respective signal received from the wafer or transmitted to the wafer using high and low signal levels.

2. The test device according to claim 1, wherein logic signal amplifiers in the signal channels are logic buffers.

3. The test device according to claim 1, wherein the logic signal amplifiers in the signal channels are in physical proximity to the needle or contact stud card.

4. The test device according to claim 1, wherein at least one of the logic signal amplifiers amplifies a respective signal received from the wafer or transmitted to the wafer using stipulated high and low levels.

5. The test device according to claim 1, wherein at least one of the logic signal amplifiers amplifies a respective signal received from the wafer or transmitted to the wafer using variable high and/or low signal levels.

6. The test device according to claim 5, wherein the variable signal levels can each be set or regulated from outside of the interposer.

7. The test device according to claim 1, wherein the interposer is configured to be retrofit with the test device.

8. The test device according to claim 5, wherein at least one of the logic signal amplifiers comprises first and second MOS transfer gates connected in parallel, and wherein the first MOS transfer gate is supplied with a high level and the second MOS transfer gate is supplied with a low level and inputs of the first and second MOS transfer gates are respectively supplied with complementary input signals.

* * * * *